(12) United States Patent
Chen et al.

(10) Patent No.: US 9,997,687 B2
(45) Date of Patent: Jun. 12, 2018

(54) LIGHT-EMITTING DEVICE

(71) Applicant: EPISTAR CORPORATION, Hsinchu (TW)

(72) Inventors: Shih-I Chen, Hsinchu (TW); Chia-Liang Hsu, Hsinchu (TW); Tzu-Chieh Hsu, Hsinchu (TW); Han-Min Wu, Hsinchu (TW); Ye-Ming Hsu, Hsinchu (TW); Chien-Fu Huang, Hsinchu (TW); Chao-Hsing Chen, Hsinchu (TW); Chiu-Lin Yao, Hsinchu (TW); Hsin-Mao Liu, Hsinchu (TW); Chien-Kai Chung, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days. days.

(21) Appl. No.: 15/401,710

(22) Filed: Jan. 9, 2017

(65) Prior Publication Data
US 2017/0117450 A1 Apr. 27, 2017

Related U.S. Application Data

(60) Continuation of application No. 14/663,544, filed on Mar. 20, 2015, now Pat. No. 9,577,170, which is a
(Continued)

(51) Int. Cl.
*H01L 33/38* (2010.01)
*H01L 33/46* (2010.01)
(Continued)

(52) U.S. Cl.
CPC .......... *H01L 33/62* (2013.01); *H01L 25/0753* (2013.01); *H01L 27/15* (2013.01);
(Continued)

(58) Field of Classification Search
CPC ......... H01L 33/08; H01L 33/10; H01L 33/32; H01L 33/40; H01L 33/42; H01L 33/44;
(Continued)

(56) References Cited

U.S. PATENT DOCUMENTS 3,871,008 A * 3/1975 Debesis .......... H01L 31/022408
136/256
6,498,049 B1 12/2002 Friend et al.
(Continued)

FOREIGN PATENT DOCUMENTS

JP H05129658 A 5/1993
JP H10223930 A 8/1998
(Continued)

OTHER PUBLICATIONS

Gessmann et al.,"AlGaInP light-emitting diodes with omni-directionally reflecting submount", in Proceedings of SPIE—The International Society for Optical Engineering, Light-emitting diodes: research manufacturing and applications, vol. 4996, Jul. 2003, retrieved on Jan. 9, 2017, from http://homepages.rpi.edu/~schubert/FutureChipsConstellation/Reprints/2003%20Gessmann%20et%20al%20(SPIE%20PW)%20AlGaInP%20light-emitting%20diodes%20with%20omni-directionally%20reflecting%20submount.pdf, 12 Pages.

*Primary Examiner* — Johannes P Mondt
(74) *Attorney, Agent, or Firm* — Ditthavong & Steiner, P.C.

(57) ABSTRACT

A light-emitting device comprising: a supportive substrate; a transparent layer formed on the supportive substrate, and the transparent layer comprising conductive metal oxide material; a light-emitting stacked layer comprising an active layer formed on the transparent layer; and an etching-stop layer formed between the light-emitting stacked layer and the supportive substrate and contacting the transparent layer,
(Continued)

wherein a thickness of the etching-stop layer is thicker than that of the transparent layer.

19 Claims, 6 Drawing Sheets

Related U.S. Application Data division of application No. 13/175,698, filed on Jul. 1, 2011, now Pat. No. 9,012,948.

(60) Provisional application No. 61/389,286, filed on Oct. 4, 2010.

(51) Int. Cl.

| | | |
|---|---|---|
| *H01L 33/60* | (2010.01) | |
| *H01L 33/62* | (2010.01) | |
| *H01L 27/15* | (2006.01) | |
| *H01L 33/42* | (2010.01) | |
| *H01L 33/08* | (2010.01) | |
| *H01L 33/10* | (2010.01) | |
| *H01L 33/14* | (2010.01) | |
| *H01L 33/44* | (2010.01) | |
| *H01L 33/48* | (2010.01) | |
| *H01L 25/075* | (2006.01) | |
| *H01L 33/32* | (2010.01) | |
| *H01L 33/40* | (2010.01) | |

(52) U.S. Cl.
CPC ............ *H01L 33/08* (2013.01); *H01L 33/10* (2013.01); *H01L 33/145* (2013.01); *H01L 33/382* (2013.01); *H01L 33/42* (2013.01); *H01L 33/44* (2013.01); *H01L 33/46* (2013.01); *H01L 33/483* (2013.01); *H01L 33/60* (2013.01); *H01L 33/32* (2013.01); *H01L 33/385* (2013.01); *H01L 33/40* (2013.01); *H01L 2924/0002* (2013.01)

(58) Field of Classification Search
CPC ....... H01L 33/46; H01L 33/483; H01L 33/60; H01L 33/62; H01L 33/382; H01L 33/385; H01L 33/145; H01L 25/0753; H01L 27/15; H01L 27/1225; H01L 2924/0002; H01L 2924/00
USPC ............... 257/43, 98, 99, E33.066, 91
See application file for complete search history.

(56) References Cited

U.S. PATENT DOCUMENTS

| | | | |
|---|---|---|---|
| 6,838,704 B2 | 1/2005 | Lin et al. | |
| 7,119,372 B2 | 10/2006 | Stokes et al. | |
| 7,132,691 B1* | 11/2006 | Tanabe | B82Y 20/00 |
| | | | 257/103 |
| 7,391,061 B2 | 6/2008 | Shieh et al. | |
| 2003/0003613 A1 | 1/2003 | Hsieh et al. | |
| 2003/0146445 A1 | 8/2003 | Hen | |
| 2003/0164503 A1 | 9/2003 | Chen | |
| 2004/0124428 A1 | 7/2004 | Lin et al. | |
| 2005/0039670 A1* | 2/2005 | Hosono | C30B 23/02 |
| | | | 117/2 |
| 2005/0062049 A1 | 3/2005 | Lin et al. | |
| 2006/0145177 A1 | 7/2006 | Hagimoto et al. | |
| 2007/0018183 A1* | 1/2007 | Denbaars | H01L 33/42 |
| | | | 257/98 |
| 2008/0230791 A1 | 9/2008 | Lin et al. | |
| 2008/0303041 A1 | 12/2008 | Lai | |
| 2009/0108286 A1 | 4/2009 | Lin et al. | |
| 2009/0200560 A1 | 8/2009 | Lin et al. | |
| 2009/0283787 A1 | 11/2009 | Donofrio et al. | |
| 2010/0074292 A1* | 3/2010 | Bour | B82Y 20/00 |
| | | | 372/45.011 |
| 2010/0078659 A1* | 4/2010 | Iizuka | H01L 33/405 |
| | | | 257/94 |
| 2010/0230705 A1* | 9/2010 | Jeong | H01L 33/42 |
| | | | 257/98 |
| 2011/0275173 A1* | 11/2011 | Khaja | H01L 21/2654 |
| | | | 438/34 |
| 2011/0297979 A1 | 12/2011 | Diana et al. | |
| 2012/0261695 A1 | 10/2012 | Chen et al. | |

FOREIGN PATENT DOCUMENTS

| | | |
|---|---|---|
| JP | 2001068786 A | 3/2001 |
| JP | 2003086836 A | 3/2003 |
| JP | 2008283096 A | 11/2008 |
| JP | 2010080817 A | 4/2010 |
| WO | 2009078574 A1 | 6/2009 |

* cited by examiner

LIGHT-EMITTING DEVICE

RELATED APPLICATION

This application is a continuation application of U.S. patent application Ser. No. 14/663,544, filed on Mar. 20, 2015, which is a division application of U.S. patent application Ser. No. 13/175,698, filed on Jul. 1, 2011, which claims the benefit of provisional application No. 61/389,286, filed on Oct. 4, 2010; the contents of which are incorporated herein by reference in their entirety.

BACKGROUND

Technical Field

The present application relates to a light-emitting device, and more particularly, to a light-emitting device having an etching-stop layer.

Description of the Related Art

Light-emitting diodes (LEDs) have been applied widely in optical display devices, traffic signals, data storing devices, communication devices, illumination devices, and medical apparatuses. In the conventional LED, a metal current-spreading layer, such as Ti/Au or Cr/Au layers, is formed between the substrate and the light-emitting stacked layer. However, the metal current-spreading layer absorbs light and results in low light-emitting efficiency of the LED.

SUMMARY OF THE DISCLOSURE

A light-emitting device comprising: a supportive substrate; a transparent layer formed on the supportive substrate, and the transparent layer comprising conductive metal oxide material; a light-emitting stacked layer comprising an active layer formed on the transparent layer; and an etching-stop layer formed between the light-emitting stacked layer and the supportive substrate and contacting the transparent layer, wherein a thickness of the etching-stop layer is thicker than that of the transparent layer.

BRIEF DESCRIPTION OF THE DRAWINGS

The accompanying figures are included to provide easy understanding of the application, are incorporated herein, and constitute a part of this specification. The drawings illustrate embodiments of the application and, together with the description, serve to illustrate the principles of the application.

DESCRIPTION OF THE PREFERRED EMBODIMENTS

The embodiments of present application will be described in detail and sketched in figures. The same or similar parts will be shown with the same numbers in every figure and the specification.

Figure 1A:
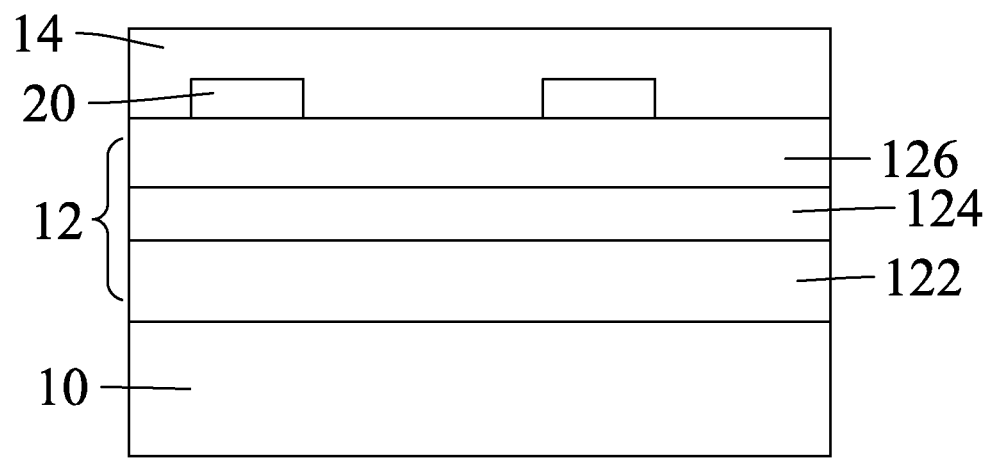
FIGS. 1A-1F illustrate flow charts of a manufacturing process of a light-emitting element in accordance with an embodiment of the present application.
Figure 1B:
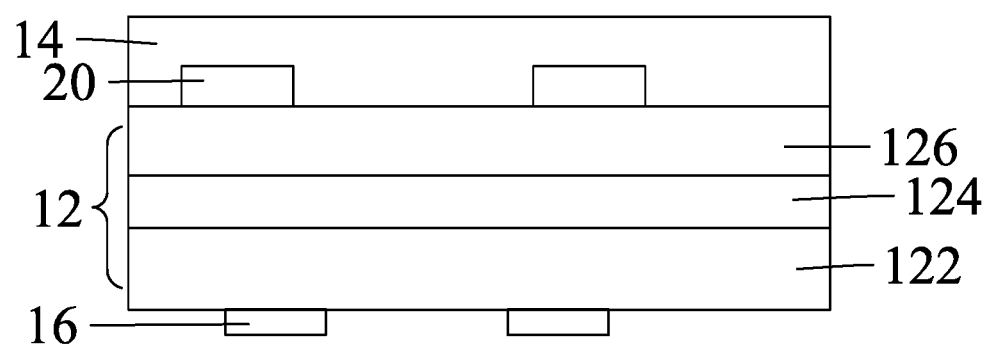
Figure 1C:
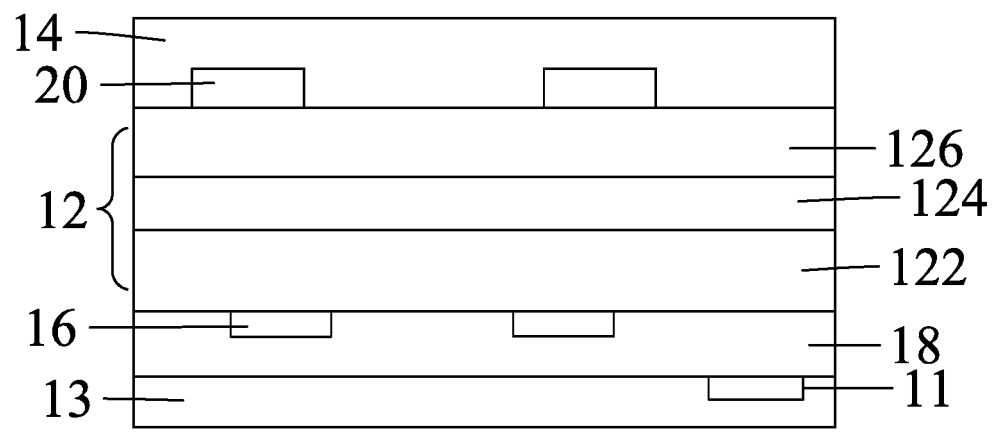
Figure 1D:
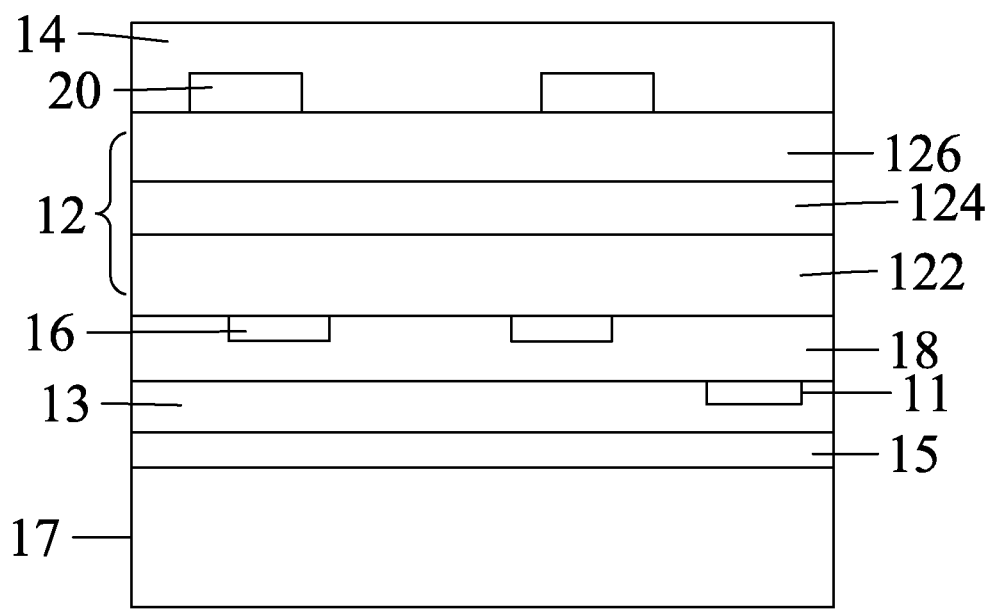
Figure 1E:
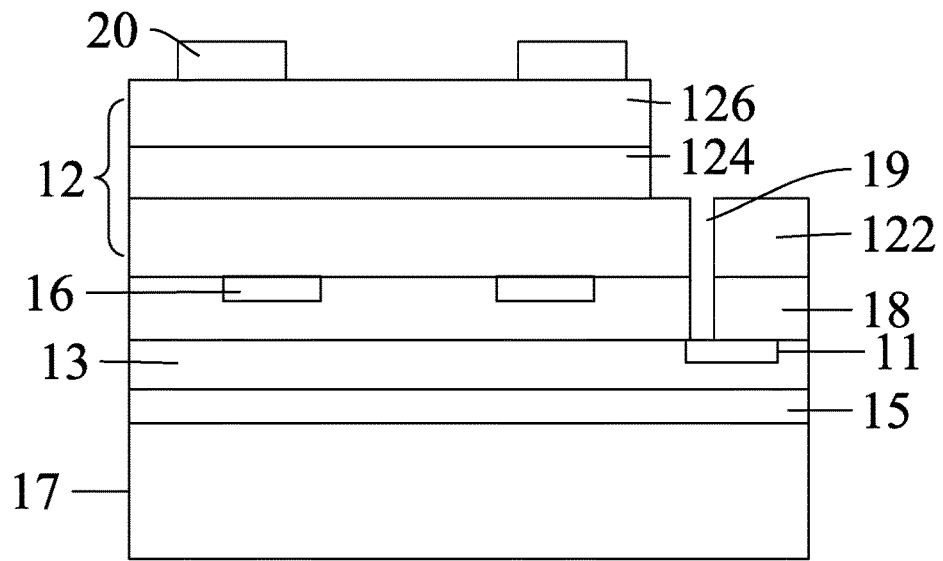
Figure 1F:
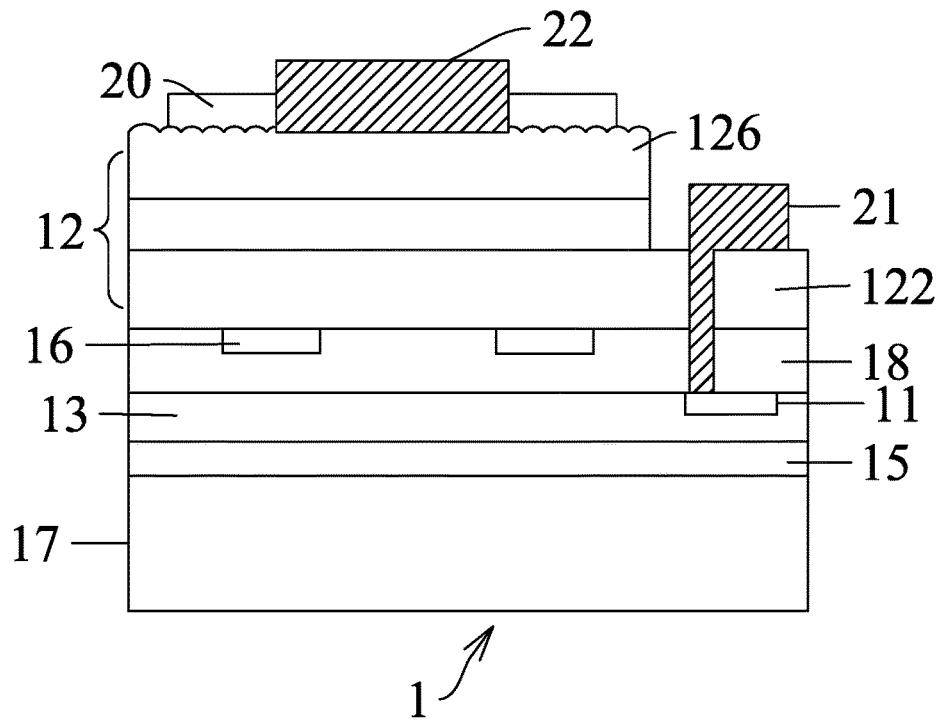

FIGS. 1A-1F are the flow charts of a manufacturing process of a light-emitting element 1. As FIG. 1A shows, there are a growth substrate 10 and a light-emitting stacked layer 12 formed on the growth substrate 10. The light-emitting stacked layer 12 includes a first semiconductor layer 122; an active layer 124 formed on the first semiconductor layer 122; and a second semiconductor layer 126 formed on the active layer 124, wherein the polarities of the first semiconductor layer 122 and the second semiconductor layer 126 are different. A plurality of conductive parts 20 is formed on the second semiconductor layer 126. A temporary substrate 14 is formed on the light-emitting stacked layer 12 and the plurality of conductive parts 20. As FIG. 1B shows, the growth substrate 10 is removed and a plurality of contact parts 16 is formed under the first semiconductor layer 122. A transparent layer 18 is formed under the first semiconductor layer 122 and covers the plurality of contact parts 16. An etching-stop layer 11 is formed under the transparent layer 18 and a reflective layer 13 is formed under the transparent layer 18 and covers the etching-stop layer 11, as FIG. 1C shows. A supportive substrate 17 is attached to the reflective layer 13 by a bonding layer 15, as FIG. 1D shows. As FIG. 1E shows, the temporary substrate 14 is removed and a portion of the second semiconductor layer 126 and the active layer 124 is removed to expose a portion of the first semiconductor layer 122. A through-hole 19 is formed on the exposed portion of the first semiconductor layer 122 and extends to the reflective layer 13 to expose a portion of the etching-stop layer 11. The top surface of the second semiconductor layer 126 is roughened to form a rough surface. A first electrode 21 is formed on the exposed portion of the first semiconductor layer 122 and fills the through-hole 19 to electrically connect with the etching-stop layer 11. A second electrode 22 is formed on the top surface of the second semiconductor layer 126 such that a light-emitting element 1 is formed as shown in FIG. 1F. The second electrode 22 electrically connects with the plurality of conductive parts 20.

The supportive substrate 17 can support the light-emitting stacked layer 12 and other layers or structures formed thereon. The material of the supportive substrate 17 can be transparent material and high thermal-dissipative material. The transparent material includes but is not limited to sapphire, diamond, glass, epoxy, quartz, acryl, $Al_2O_3$, ZnO, or AlN. The high thermal-dissipative material includes but is not limited to Cu, Al, Mo, Cu—Sn, Cu—Zn, Cu—Cd, Ni—Sn, Ni—Co, Au alloy, diamond like carbon (DLC), graphite, carbon fiber, metal matrix composite (MMC), ceramic matrix composite (CMC), polymer matrix composite (PMC), Si, IP, ZnSe, GaAs, SiC, GaP, GaAsP, ZnSe, InP, $LiGaO_2$, or $LiAlO_2$. The bonding layer 15 can adhesively connect the supportive substrate 17 and the reflective layer 13 and further includes a plurality of sublayers (not shown). The material of the bonding layer 15 can be insulating material and conductive material. The insulating material includes but is not limited to polyimide (PI), benzocyclobutene (BCB), perfluorocyclobutane (PFCB), MgO, Su8, epoxy, acrylic resin, cyclic olefin copolymer (COC), polymethyl methacrylate (PMMA), polyethylene terephthalate (PET), polycarbonate (PC), polyetherimide, fluorocarbon polymer, glass, $Al_2O_3$, $SiO_x$, $TiO_2$, $SiN_x$, or spin-on-glass (SOG). The conductive material includes but is not limited to ITO, InO, SnO, CTO, ATO, AZO, ZTO, GZO, ZnO, AlGaAs, GaN, GaP, GaAs, GaAsP, IZO, $Ta_2O_5$, DLC, Cu, Al, In, Sn, Au, Pt, Zn, Ag, Ti, Ni, Pb, Pd, Ge, Cr, Cd, Co, Mn, Sb, Bi, Ga, Tl, Po, Ir, Re, Rh, Os, W, Li, Na, K, Be, Mg, Ca, Sr, Ba, Zr, Mo, La, Ag—Ti, Cu—Sn, Cu—Zn, Cu—Cd, Sn—Pb—Sb, Sn—Pb—Zn, Ni—Sn, Ni—Co, Au alloy, and so on. The reflective layer 13 can reflect the light emitted from the light-emitting stacked layer 12. The material of the reflective layer 13 includes but is not limited to Cu, Al, In, Sn, Au, Pt, Zn, Ag, Ti, Ni, Pb, Pd, Ge, Cr, Cd, Co, Mn, Sb, Bi, Ga, Tl, Po, Ir, Re, Rh, Os, W, Li, Na, K, Be, Mg, Ca, Sr, Ba, Zr, Mo, La, Ag—Ti, Cu—Sn, Cu—Zn, Cu—Cd, Sn—Pb—Sb, Sn—Pb—Zn, Ni—Sn, Ni—Co, Au alloy, and so on. The etching-stop layer 11 can conduct current and protect the reflective layer 13 from being damaged. The material of the etching-stop layer 11 includes but is not limited to conductive material such as Cu, Al, In, Sn, Au, Pt, Zn, Ag, Ti, Ni, Pb, Pd, Ge, Cr, Cd, Co, Mn, Sb, Bi, Ga, Tl, Po, Ir, Re, Rh, Os, W, Li, Na, K, Be, Mg, Ca, Sr, Ba, Zr, Mo, La, Cr—Au, Ag—Ti, Cu—Sn, Cu—Zn, Cu—Cd, Sn—Pb—Sb, Sn—Pb—Zn, Ni—Sn, Ni—Co, Au alloy, Ge—Au—Ni, AlGaAs, GaN, GaP, GaAs, GaAsP, and so on. The transparent layer 18 can improve current spreading, form the omnidirectional reflector (ODR) with the reflective layer 13 to enhance the probability of reflecting the light generated from the light-emitting stacked layer 12, and protect the light-emitting stacked layer 12 from being damaged by the element diffused from the material of the reflective layer 13. It can further include a plurality of sublayers (not shown). The material of the transparent layer 18 can be insulating material and conductive material. The insulating material includes but is not limited to PI, BCB, PFCB, MgO, Sub, epoxy, acrylic resin, COC, PMMA, PET, PC, polyetherimide, fluorocarbon polymer, glass, $Al_2O_3$, $SiO_x$, $TiO_2$, $SiN_x$, or SOG. The conductive material includes but not limited to ITO, InO, SnO, CTO, ATO, AZO, ZTO, GZO, ZnO, AlGaAs, GaN, GaP, GaAs, GaAsP, IZO, $Ta_2O_5$, or DLC. The transparent layer 18 also can conduct and spread current when it is conductive.

The plurality of contact parts 16 can conduct and spread current. Each of the plurality of contact parts 16 is independent from each other. It can further include a plurality of sublayers (not shown). The material of the plurality of contact parts 16 includes but is not limited to conductive material such as Cu, Al, In, Sn, Au, Pt, Zn, Ag, Ti, Ni, Pb, Pd, Ge, Cr, Cd, Co, Mn, Sb, Bi, Ga, Tl, Po, Ir, Re, Rh, Os, W, Li, Na, K, Be, Mg, Ca, Sr, Ba, Zr, Mo, La, Ge—Au, Cr—Au, Ag—Ti, Cu—Sn, Cu—Zn, Cu—Cd, Sn—Pb—Sb, Sn—Pb—Zn, Ni—Sn, Ni—Co, Au alloy, Ge—Au—Ni, AlGaAs, GaN, GaP, GaAs, GaAsP, and so on. The shape of each of the plurality of contact parts 16 can be triangle, rectangle, trapezoid, circle, and so on. The diameter of the circle contact part, for example, can be 3~15 µm, preferably 6~10 µm. The ratio of the area of the plurality of contact parts 16 to the area of the top surface of the active layer 124 is about 0.5~6%, preferably 1~3%. To improve the current spreading, the area of some of the plurality of contact parts 16 near the corners of the transparent layer 18 is larger than that of the other contact parts. The distance between each of the plurality of contact parts 16 depends on the thickness of the first semiconductor layer 122. When the thickness of the first semiconductor layer 122 is about 3 µm, for instance, the distance between each of the plurality of contact parts 16 is about 20~40 µm. The thinner the thickness of the first semiconductor layer 122 is, the smaller the distance between each of the plurality of contact parts 16 is. The plurality of contact parts 16 can be arranged into two or three lines between any two adjacent conductive parts 20 to improve current spreading. Moreover, the plurality of contact parts 16 is not covered by the second electrode 22 and the plurality of conductive parts 20. Namely, the second electrode 22 and the plurality of conductive parts 20 are not located right above the plurality of contact parts 16.

The semiconductor stacked layer 12 can generate light and include semiconductor material containing more than one element selected from a group consisting of Ga, Al, In, As, P, N, Zn, Cd, and Se. The first and second electrodes 21 and 22 are for receiving external voltage. The material of the first and second electrodes 21 and 22 can be transparent conductive material and metal material. The transparent conductive material includes but is not limited to ITO, InO, SnO, CTO, ATO, AZO, ZTO, GZO, ZnO, AlGaAs, GaN, GaP, GaAs, GaAsP, IZO, $Ta_2O_5$, or DLC. The metal material includes but is not limited to Cu, Al, In, Sn, Au, Pt, Zn, Ag, Ti, Ni, Pb, Pd, Ge, Cr, Cd, Co, Mn, Sb, Bi, Ga, Tl, Po, Ir, Re, Rh, Os, W, Li, Na, K, Be, Mg, Ca, Sr, Ba, Zr, Mo, La, Cr—Au, Ag—Ti, Cu—Sn, Cu—Zn, Cu—Cd, Sn—Pb—Sb, Sn—Pb—Zn, Ni—Sn, Ni—Co, Au alloy, and so on. The plurality of conductive parts 20 can conduct and spread current. The material of the plurality of conductive parts 20 can be transparent conductive material or metal material. The transparent conductive material includes but is not limited to ITO, InO, SnO, CTO, ATO, AZO, ZTO, GZO, ZnO, AlGaAs, GaN, GaP, GaAs, GaAsP, IZO, $Ta_2O_5$, or DLC. The metal material includes but is not limited to Cu, Al, In, Sn, Au, Pt, Zn, Ag, Ti, Ni, Pb, Pd, Ge, Cr, Cd, Co, Mn, Sb, Bi, Ga, Tl, Po, Ir, Re, Rh, Os, W, Li, Na, K, Be, Mg, Ca, Sr, Ba, Zr, Mo, La, Cr—Au, Ag—Ti, Cu—Sn, Cu—Zn, Cu—Cd, Sn—Pb—Sb, Sn—Pb—Zn, Ni—Sn, Ni—Co, Au alloy, and so on.

Figure 2:
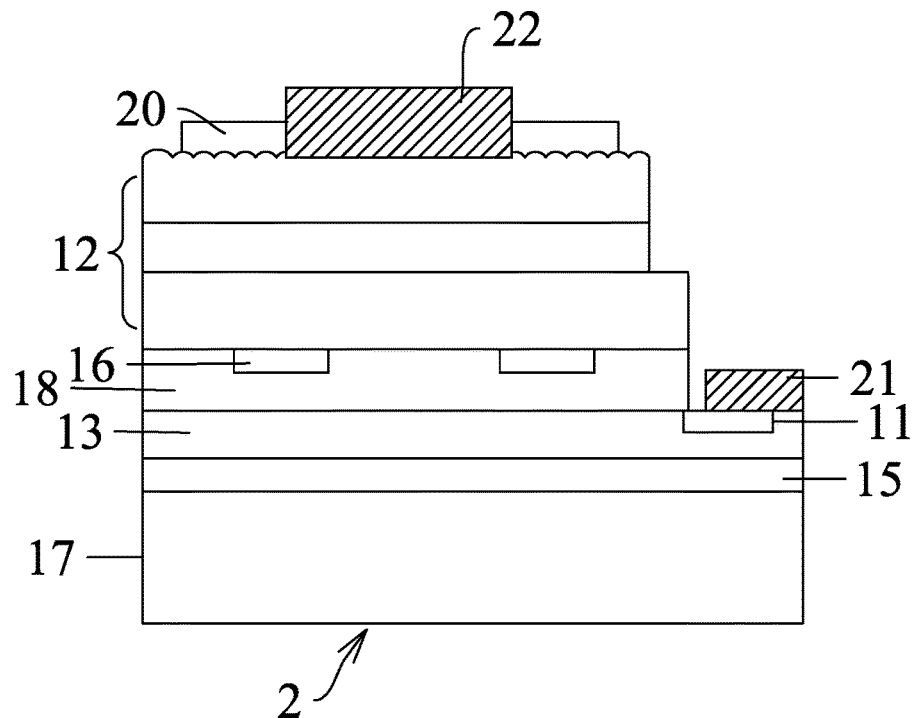
FIG. 2 illustrates a cross-sectional view of a light-emitting element in accordance with another embodiment of the present application.

FIG. 2 shows a light-emitting element 2 similar to what is shown in FIG. 1. The difference is that a portion of the light-emitting stacked layer 12 and the transparent layer 18 are removed to expose at least a portion of the reflective layer 13 and the etching-stop layer 11. The first electrode 21 is formed on the exposed portion of the reflective layer 13 and the etching-stop layer 11.

Figure 3:
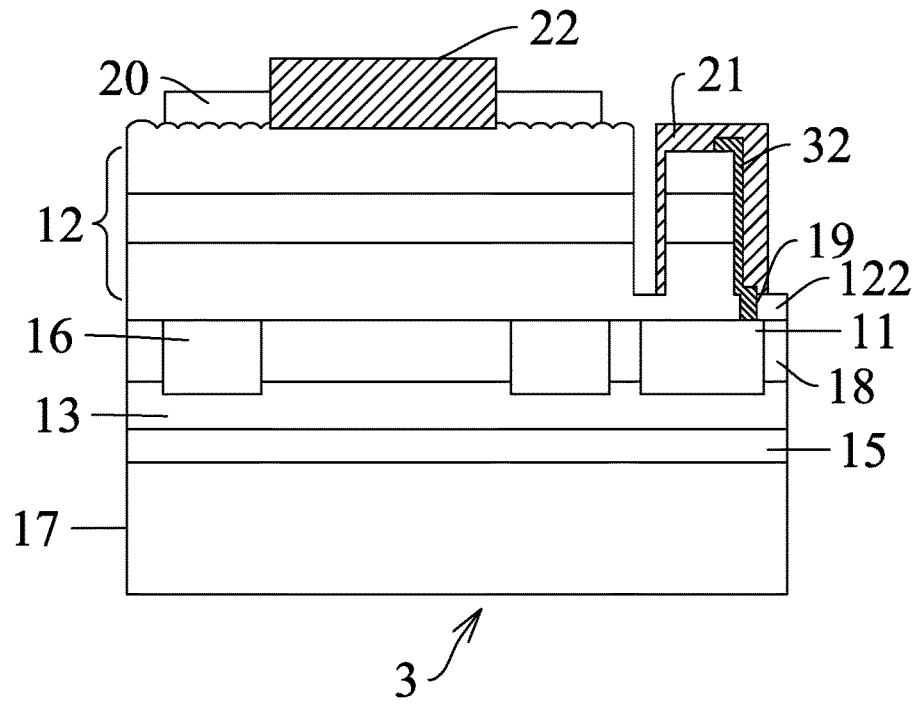
FIG. 3 illustrates a cross-sectional view of a light-emitting element in accordance with another embodiment of the present application.

FIG. 3 shows a light-emitting element 3 containing the supportive substrate 17; the bonding layer 15 formed on the supportive substrate 17; the reflective layer 13 formed on the bonding layer 15; the transparent layer 18 formed on the reflective layer 13; the light-emitting stacked layer 12 formed on the transparent layer 18, wherein the plurality of contact parts 16 and the etching-stop layer 11 are formed between the light-emitting stacked layer 12 and the reflective layer 13 and are surrounded by the transparent layer 18. A portion of the light-emitting stacked layer 12 is removed to expose a portion of the first semiconductor layer 122, and the etching-stop layer 11 is formed under the bottom surface of the light-emitting stacked layer 12. The plurality of contact parts 16 and the etching-stop layer 11 can physically contact the reflective layer 13. The through-hole 19 is formed on the exposed portion of the first semiconductor layer 122 and extends through the first semiconductor layer 122 to expose a portion of the etching-stop layer 11. The first electrode 21 can be formed on the part of the light-emitting stacked layer 12 where the second electrode 22 and the plurality of conductive parts 20 are not formed, extend along the sidewall of the light-emitting stacked layer 12, and electrically connect with the etching-stop layer 11. The first electrode 21 can also optionally fill the through-hole 19 to electrically connect with the etching-stop layer 11. Moreover, there can be a conductive layer 32 which is formed on the light-emitting stacked layer 12 extending along the sidewall of the light-emitting stacked layer 12, and filling the through-hole 19 to electrically connect with the etching-stop layer 11; wherein the first electrode 21 is formed on the light-emitting stacked layer 12 and the conductive layer 32 to electrically connect with the etching-stop layer 11. The sidewall of the light-emitting stacked layer 12 is free of being enclosed by the light-emitting stacked layer 12. The conductive layer 32 can be metal material and be formed by electroless plating. The metal material includes but is not limited to Cu, Al, In, Sn, Au, Pt, Zn, Ag, Ti, Ni, Pb, Pd, Ge, Cr, Cd, Co, Mn, Sb, Bi, Ga, Tl, Po, Ir, Re, Rh, Os, W, Li, Na, K, Be, Mg, Ca, Sr, Ba, Zr, Mo, La, Cr—Au, Ag—Ti, Cu—Sn, Cu—Zn, Cu—Cd, Sn—Pb—Sb, Sn—Pb—Zn, Ni—Sn, Ni—Co, Au alloy, and so on. The conductive layer 32 can improve the quality of the formation of the first electrode 21 to enhance the electrical connection between the first electrode 21 and the etching-stop layer 11.

Figure 4:
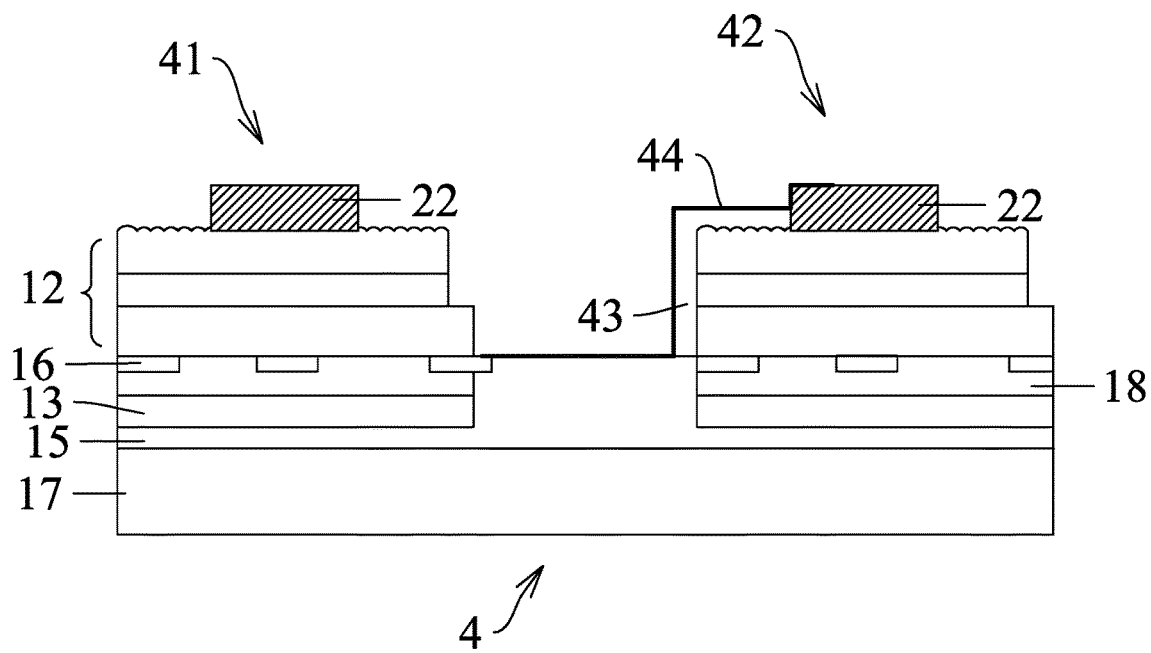
FIG. 4 illustrates a cross-sectional view of a light-emitting device in accordance with an embodiment of the present application.

As FIG. 4 shows, a light-emitting device 4 includes at least a first light-emitting element 41 and a second light-emitting element 42 located commonly on a supportive substrate 17. The first light-emitting element 41 and the second light-emitting element 42 are similar to the light-emitting element 2. The difference is that the bonding layer 15 is further formed between the first light-emitting element 41 and the second light-emitting element 42 to separate the first light-emitting element 41 and the second light-emitting element 42, and the material of the bonding layer 15 can be insulating material. The bonding layer 15 can physically contact at least one of the contact parts 16. An insulating layer 43 is formed on portions of a lateral side and the top surface of the second light-emitting element 42 which are near the first light-emitting element 41. A metal line 44 is formed on the insulating layer 43 and the bonding layer 15 to electrically connect at least one of the contact parts 16 of the first light-emitting element 41 to the second electrode 22 of the second light-emitting element 42. The metal line 44 can further contact a portion of the light-emitting stacked layer 12 of the second light-emitting element 42 in another embodiment. The first light-emitting element 41 and the second light-emitting element 42 do not contain the first electrodes 21 shown in other embodiments.

The material of the insulating layer 43 can be insulating material such as PI, BCB, PFCB, MgO, Su8, epoxy, acrylic resin, COC, PMMA, PET, PC, polyetherimide, fluorocarbon polymer, glass, $Al_2O_3$, $SiO_x$, $TiO_2$, $SiN_x$, or SOG. The material of the metal line 44 can be metal material such as Cu, Al, In, Sn, Au, Pt, Zn, Ag, Ti, Ni, Pb, Pd, Ge, Cr, Cd, Co, Mn, Sb, Bi, Ga, Tl, Po, Ir, Re, Rh, Os, W, Li, Na, K, Be, Mg, Ca, Sr, Ba, Zr, Mo, La, Cr—Au, Ag—Ti, Cu—Sn, Cu—Zn, Cu—Cd, Sn—Pb—Sb, Sn—Pb—Zn, Ni—Sn, Ni—Co, Au alloy, and so on.

Figure 5:
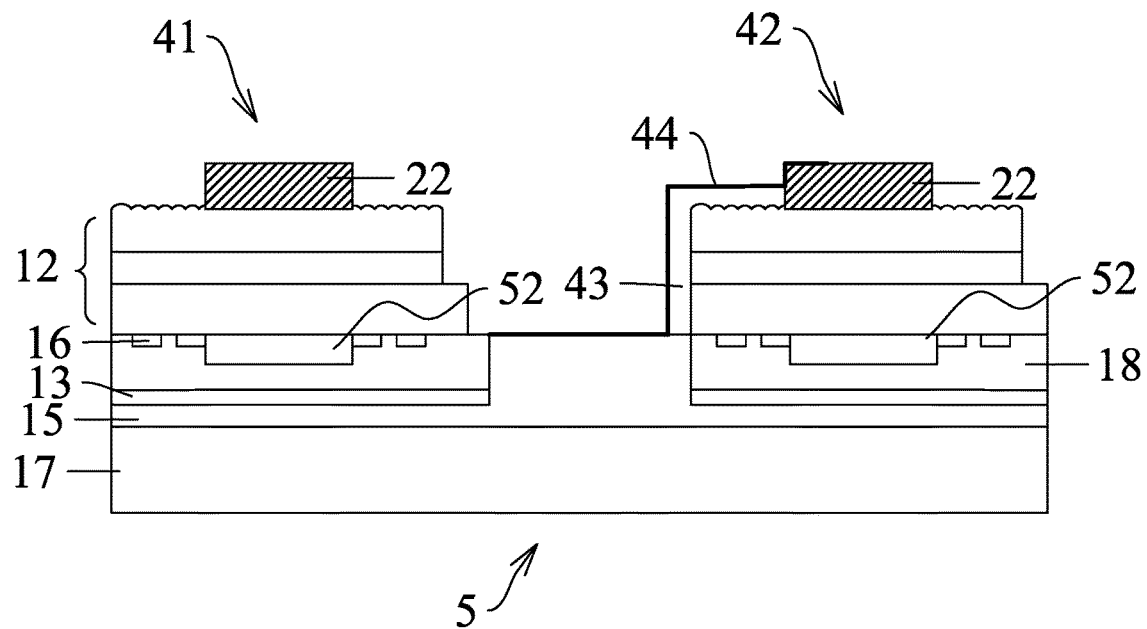
FIG. 5 illustrates a cross-sectional view of a light-emitting device in accordance with another embodiment of the present application.

As FIG. 5 shows, a light-emitting device 5 is similar to the light-emitting device 4. Each of the first light-emitting element 41 and the second light-emitting element 42 of the light-emitting device 5 further includes a current-blocking layer 52 formed between the light-emitting stacked layer 12 and the transparent layer 18.

The plurality of contact parts 16 surrounds the current-blocking layer 52. The current-blocking layer 52 is located right under the second electrode 22 and can include a plurality of extension portions (not shown here) similar to the second electrode 22. The metal line 44 electrically connects the transparent layer 18 of the first light-emitting element 41 to the second electrode 22 of the second light-emitting element 42. The material of the current-blocking layer 52 can be insulating material such as PI, BCB, PFCB, MgO, Su8, epoxy, acrylic resin, COC, PMMA, PET, PC, polyetherimide, fluorocarbon polymer, silicone, glass, $Al_2O_3$, $SiO_x$, $TiO_2$, $SiN_x$, SOG, and so on.

Figure 6:
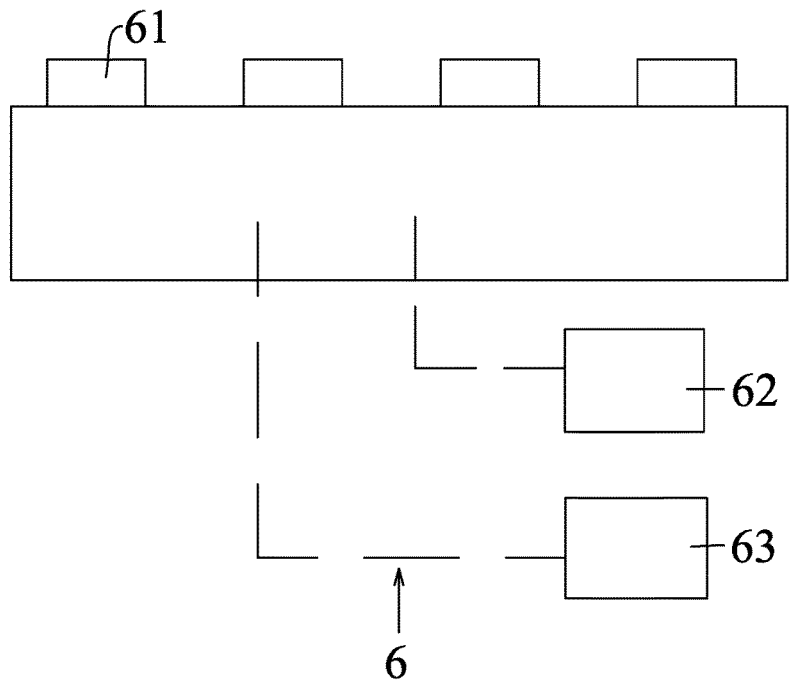
FIG. 6 illustrates a schematic diagram of a light-generating device in accordance with an embodiment of the present application.

FIG. 6 illustrates a diagram of a light-generating device. A light-generating device 6 includes a chip manufactured by a wafer containing the light-emitting element or the light-emitting device of any one of the embodiments of the present application. A light-generating device 6 can be an illumination device such as a street light, a lamp of vehicle, or an illustration source for interior. The light-generating device 6 can be also a traffic sign, or a backlight of a backlight module of an LCD. The light-generating device 6 includes a light source 61 adopting the foregoing light-emitting elements or light-emitting devices; a power supplying system 62 providing current to the light source 61; and a control element 63 controlling the power supplying system 62.

Figure 7:
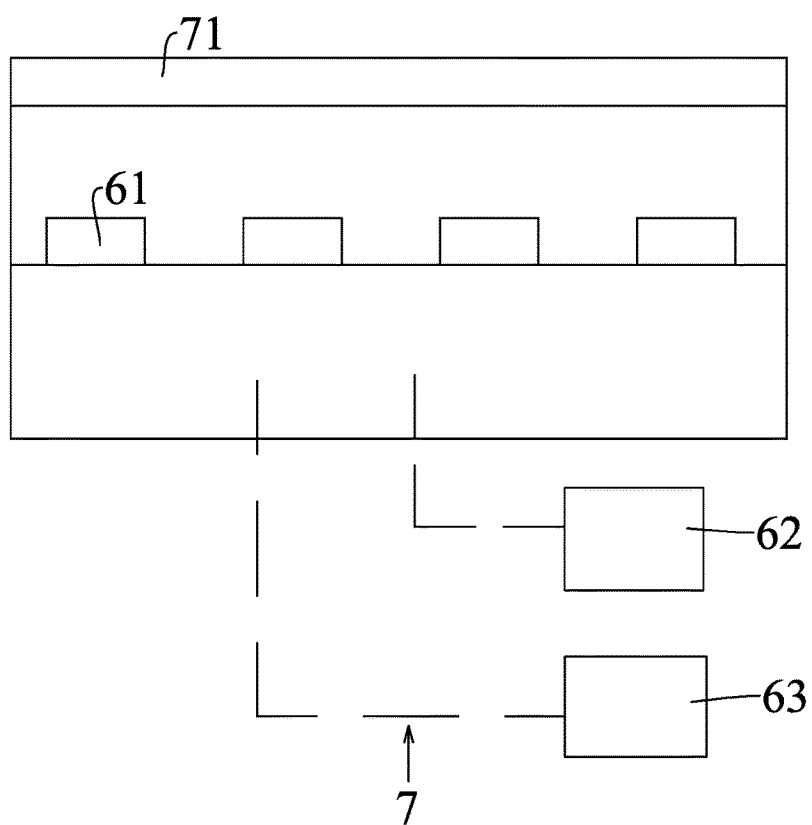
FIG. 7 illustrates a schematic diagram of a back light module in accordance with an embodiment of the present application.

FIG. 7 illustrates a cross-sectional schematic diagram of a back light module 7. A back light module 7 includes the light-generating device 6 of the foregoing embodiment, and an optical element 71. The optical element 71 can process the light generated by the light-generating device 6 for LCD application, such as scattering the light emitted from the light-generating device 6.

Although the present application has been explained above, it is not the limitation of the range, the sequence in practice, the material in practice, or the method in practice. Any modification or decoration for present application is not detached from the spirit and the range of such.

What is claimed is:

1. A light-emitting device comprising:
   a supportive substrate;
   a transparent layer formed on the supportive substrate, and the transparent layer comprising conductive metal oxide material;
   a reflective layer between the supportive substrate and the transparent layer;
   a light-emitting stacked layer comprising an active layer formed on the transparent layer;
   an etching-stop layer formed between the light-emitting stacked layer and the supportive substrate and contacting the transparent layer; and
   a first electrode on the transparent layer and electrically connecting to the etching-stop layer,
   wherein a thickness of the etching-stop layer is thicker than that of the transparent layer in a cross section view of the light-emitting device.

2. The light-emitting device of claim 1, wherein the etching-stop layer physically contacts with a bottom surface of the light-emitting stacked layer.

3. The light-emitting device of claim 1, further comprising a plurality of contact parts between the light-emitting stacked layer and the transparent layer.

4. The light-emitting device of claim 1, wherein the supportive substrate comprises a material which is transparent to a light emitted from the light-emitting stacked layer.

5. The light-emitting device of claim 1, further comprising a through-hole in the light-emitting stacked layer, and the first electrode physically contacting the etching-stop layer by the through-hole.

6. The light-emitting device of claim 5, wherein the through-hole is devoid of passing through the active layer.

7. The light-emitting device of claim 3, wherein the etching-stop layer and the plurality of the contact parts are on a same horizontal level in a cross-sectional view.

8. The light-emitting device of claim 1, wherein the light-emitting stacked layer comprises a first region and a second region smaller than the first region, and the first electrode covers the second region.

9. The light-emitting device of claim 1, wherein a side surface of the etching-stop layer is covered by the transparent layer.

10. The light-emitting device of claim 1, wherein further comprising a second electrode having a second top surface away from the supportive substrate on the transparent layer, wherein a first top surface of the first electrode is away from the supportive substrate and lower than the second top surface of the second electrode.

11. The light-emitting device of claim 3, wherein the plurality of contact parts comprises a conductive material selected from a group consisting of Cu, Al, In, Sn, Au, Pt, Zn, Ag, Ti, Ni, Pb, Pd, Ge, Cr, Cd, Co, Mn, Sb, Bi, Ga, Tl, Po, Ir, Re, Rh, Os, W, Li, Na, K, Be, Mg, Ca, Sr, Ba, Zr, Mo, La, GeAu, CrAu, Ag—Ti, Cu—Sn, Cu—Zn, Cu—Cd, Sn—Pb—Sb, Sn—Pb—Zn, Ni—Sn, Ni—Co, Au alloy, Ge—Au—Ni, AlGaAs, GaN, GaP, GaAs, and GaAsP.

12. The light-emitting device of claim 3, wherein each of the plurality of contact parts is separated from each other.

13. The light-emitting device of claim 3, wherein one of the contact parts comprises a top-view shape of a triangle, a rectangle, a trapezoid, or a circle.

14. The light-emitting device of claim 3, wherein the light-emitting stacked layer comprises, in addition to the active layer, a first semiconductor layer and a second semiconductor layer, and a ratio of the area of the plurality of contact parts to the area of a top surface of the active layer is 0.5~6%.

15. The light-emitting device of claim 1, wherein the transparent layer comprises a conductive material selected from a group consisting of ITO, InO, SnO, CTO, ATO, AZO, ZTO, GZO, ZnO, AlGaAs, GaN, GaP, GaAs, GaAsP, IZO, $Ta_2O_5$, GZO, and DLC.

16. The light-emitting device of claim 1, wherein the transparent layer and the reflective layer form an omnidirectional reflector (ODR).

17. The light-emitting device of claim 2, wherein the transparent layer physically contacts the bottom surface of the light-emitting stacked layer.

18. A light-emitting device comprising:
a supportive substrate;
a transparent layer formed on the supportive substrate, and the transparent layer comprising conductive metal oxide material;
a light-emitting stacked layer comprising an active layer formed on the transparent layer;
a bonding layer formed between the light-emitting stacked layer and the supportive substrate;
an etching-stop layer formed between the light-emitting stacked layer and the supportive substrate and contacting the transparent layer;
a through-hole in the light-emitting stacked layer; and
a first electrode on the transparent layer and physically contacting the etching-stop layer by the through-hole,
wherein a thickness of the etching-stop layer is thicker than that of the transparent layer in a cross section view of the light-emitting device.

19. A light-emitting device comprising:
a supportive substrate;
a transparent layer formed on the supportive substrate, and the transparent layer comprising conductive metal oxide material;
a reflective layer between the supportive substrate and the transparent layer;
a light-emitting stacked layer comprising an active layer formed on the transparent layer; and
an etching-stop layer formed between the light-emitting stacked layer and the supportive substrate and contacting the transparent layer,
wherein a thickness of the etching-stop layer is thicker than that of the transparent layer in a cross section view of the light-emitting device,
wherein the transparent layer and the reflective layer form an omnidirectional reflector (ODR).

* * * * *